(12) United States Patent
Abe

(10) Patent No.: US 7,689,401 B2
(45) Date of Patent: Mar. 30, 2010

(54) METHOD OF CIRCUIT SIMULATION FOR DELAY CHARACTERISTIC EVALUATION, CIRCUIT SIMULATION PROGRAM AND CIRCUIT SIMULATION DEVICE

(75) Inventor: Yasunori Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 490 days.

(21) Appl. No.: 11/066,430

(22) Filed: Feb. 28, 2005

(65) Prior Publication Data
US 2006/0111885 A1    May 25, 2006

(30) Foreign Application Priority Data
Nov. 19, 2004  (JP) ............... 2004-336330

(51) Int. Cl.
*G06F 17/50* (2006.01)
(52) U.S. Cl. ....................................................... 703/19
(58) Field of Classification Search ................... 703/19
See application file for complete search history.

(56) References Cited

U.S. PATENT DOCUMENTS

| | | | |
|---|---|---|---|
| 5,446,676 A * | 8/1995 | Huang et al. | 703/19 |
| 5,883,811 A * | 3/1999 | Lam | 716/6 |
| 5,946,475 A * | 8/1999 | Burks et al. | 716/6 |
| 7,000,202 B1 * | 2/2006 | Srinivasan et al. | 716/4 |
| 7,117,461 B1 * | 10/2006 | Srinivasan et al. | 716/4 |
| 2003/0115035 A1 * | 6/2003 | Kulshreshtha et al. | 703/19 |
| 2006/0048085 A1 * | 3/2006 | Tyler et al. | 716/6 |

FOREIGN PATENT DOCUMENTS

JP     11-296572    10/1999

OTHER PUBLICATIONS

Ravishankar Arunachalam et al.; "CMOS Gate Delay Models for General RLC Loading", 1997, Proceedings of Conference on Computer Design: VLSI in Computers and Processors, pp. 224-229.*
Neil H. E. Weste et al.; "Principles of CMOS Design", second edition, 1993, Addison-Wesley, p. 7.*
Neil H. E. Weste et al.; "Principles of CMOS Design", second edition, 1993, Addison-Wesley, pp. 72-73.*

* cited by examiner

*Primary Examiner*—Paul L Rodriguez
*Assistant Examiner*—Russ Guill
(74) *Attorney, Agent, or Firm*—Staas & Halsey LLP

(57) ABSTRACT

In delay characteristic evaluation of a logical circuit, there was the problem of underestimation of the output load compared with the actual output load.

There is provided a simulation device including a simplification section that, simplifies the load circuit using a transistor with which a virtual control voltage source is connected, by specifying a transistor driven through the output terminal of the target circuit and connecting to the drain of this transistor the virtual control voltage source whereby the output potential of this transistor is varied in accordance with the gate potential of this transistor.

13 Claims, 12 Drawing Sheets

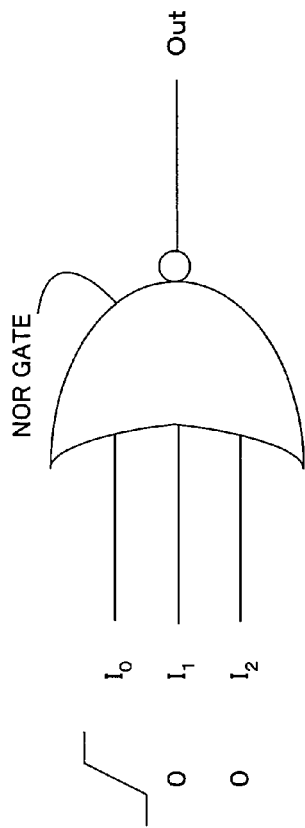
Fig. 1A
Fig. 1B
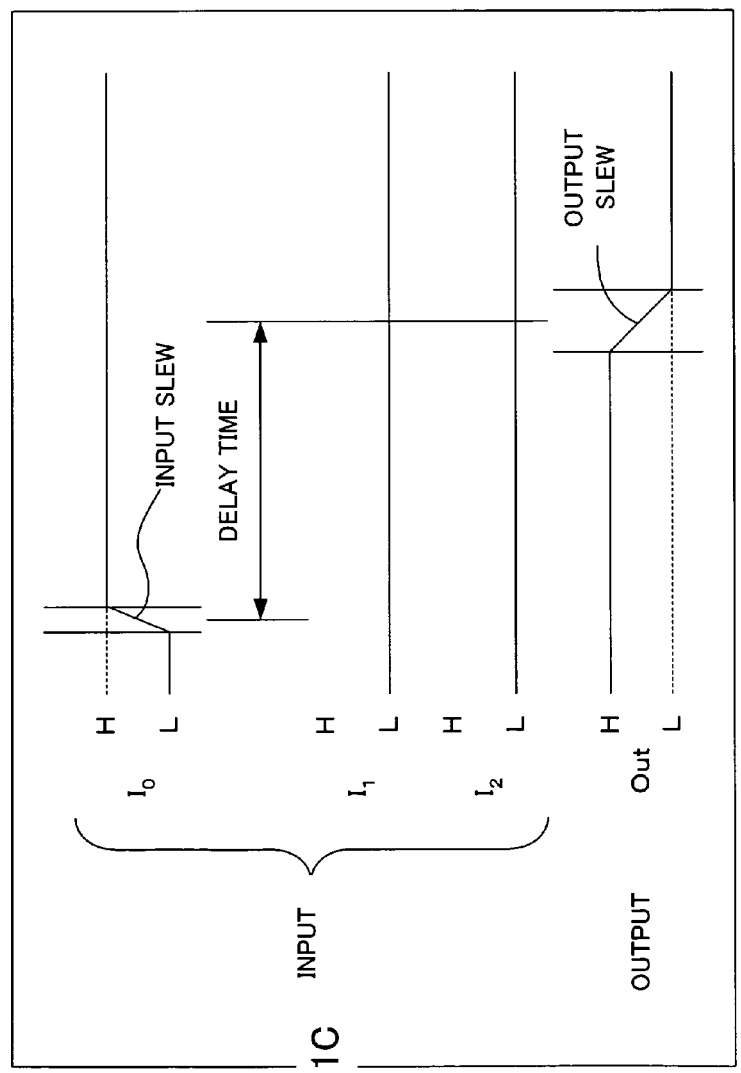
Fig. 1C

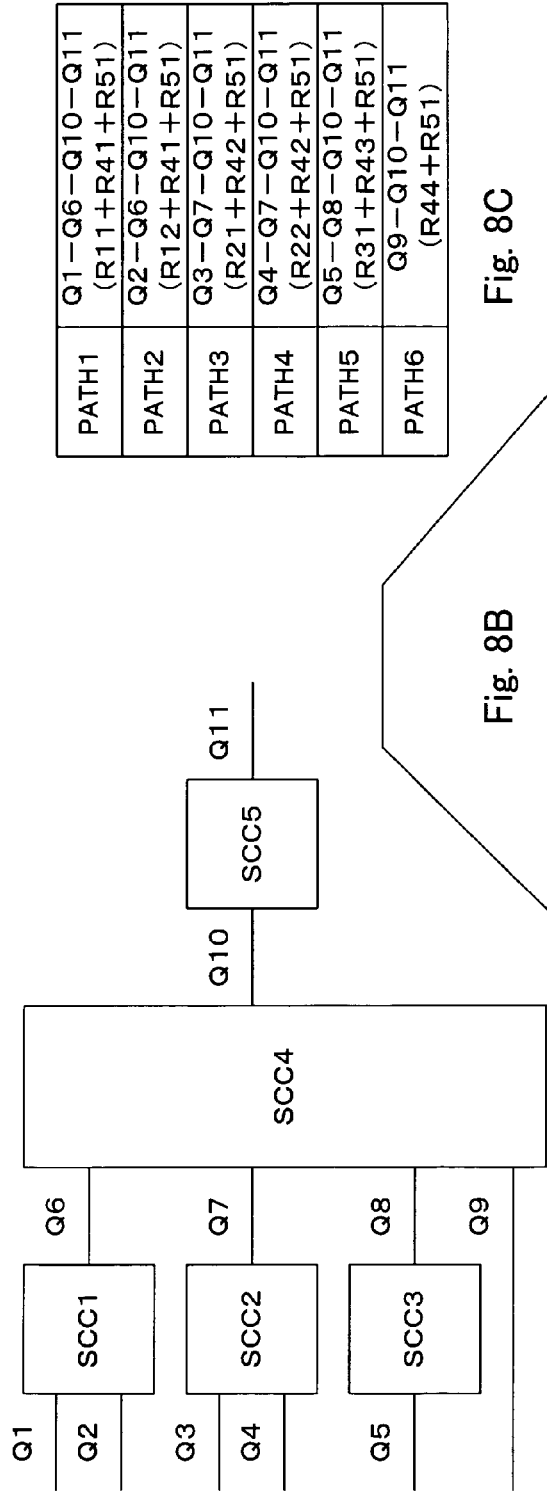
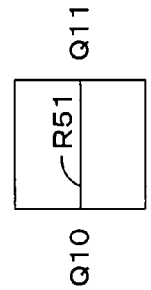
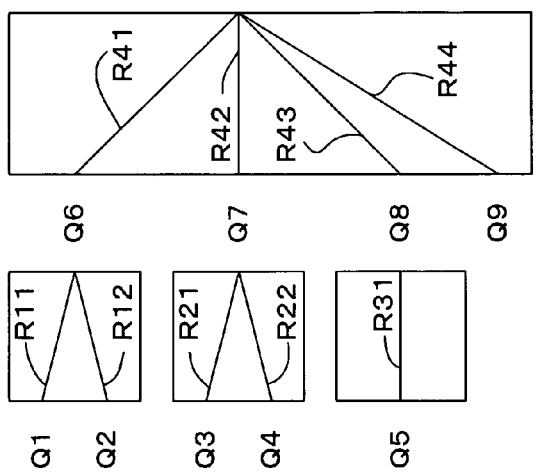
Fig. 8A
Fig. 8B
Fig. 8C

Fig. 9

| RANKING | COMBINATION (TARGET CIRCUIT+LOAD CIRCUIT) |
|---|---|
| 1 | SCC1＋SCC4 |
| 2 | SCC2＋SCC4 |
| 3 | SCC3＋SCC4 |
| 4 | SCC4＋SCC5 |
| 5 | SCC5(＋EXTERNAL LOAD) |

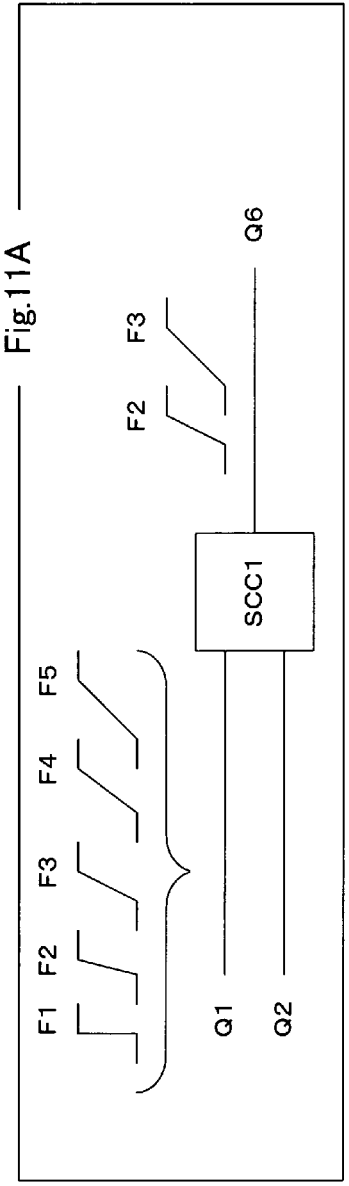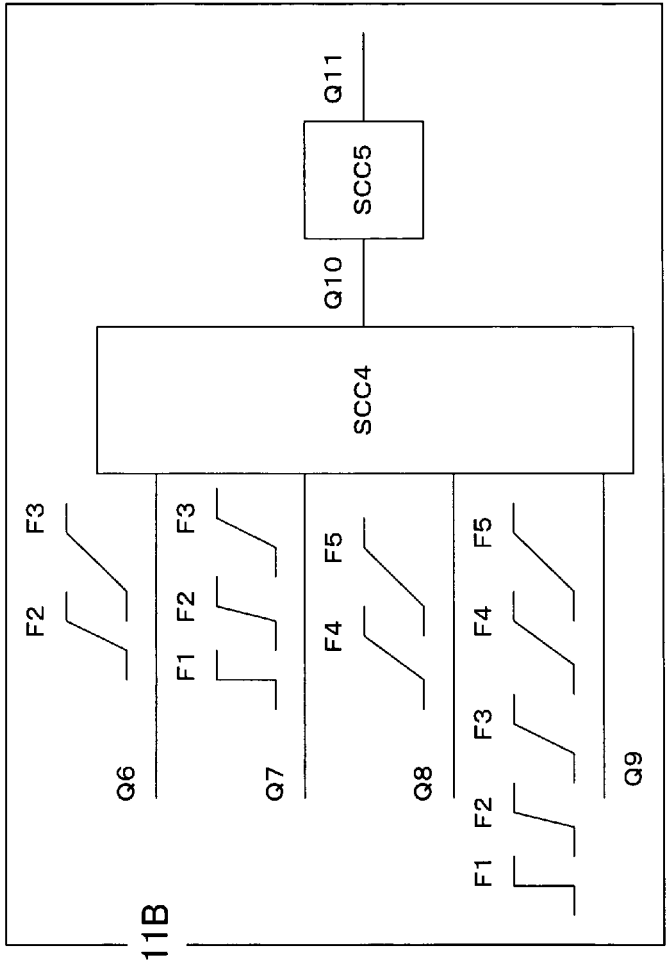

Fig.12

| PATH | INPUT/OUTPUT PATTERN | MAXIMUM/ MINIMUM | DELAY TIME | OUTPUT SLEW |
|---|---|---|---|---|
| PATH1 | Up→Up | MAX | Td1 | Tsout1 |
| | | MIN | Td2 | Tsout2 |
| | Up→Down | MAX | ... | ... |
| | | MIN | ... | ... |
| | Down→Up | MAX | ... | ... |
| | | MIN | ... | ... |
| | Down→Down | MAX | ... | ... |
| | | MIN | ... | ... |
| PATH2 | ... | ... | ... | ... |
| ... | ... | ... | ... | ... |
| PATH6 | Down→Down | MAX | ... | ... |
| | | MIN | ... | ... |

METHOD OF CIRCUIT SIMULATION FOR DELAY CHARACTERISTIC EVALUATION, CIRCUIT SIMULATION PROGRAM AND CIRCUIT SIMULATION DEVICE

BACKGROUND OF THE INVENTION

1. Field of the Invention

The present invention relates to a circuit simulation method for delay characteristic evaluation of a circuit in LSI (Large Scale Integration) and in particular relates to a method of performing simulation by simplifying the circuit and an associated program and device.

2. Description of the Related Art

As a method of evaluating delay characteristics in an integrated circuit, the method is known of dividing an integrated circuit into partial circuits and performing delay characteristic evaluation for each of the resulting partial circuits (called "target blocks"). As a method of dividing an integrated circuit into partial circuits, for example, the SCC (source-connected device clusters) boundary method may be employed in which, taking a drain of a transistor as a starting point, transistors or resistors that are connected with the power source or a gate are identified as source-connected device groups and division is effected using the gate input terminals as boundaries.

In this way, it is possible to perform delay characteristic evaluation by dividing out circuits (hereinbelow referred to as output load circuits) that are connected with the output-side terminals of the target blocks, in the same way as the target blocks were divided out, and combining these two and employing them in a simulation. This delay characteristic evaluation takes into account the output loads thereof as being the same as in the actual integrated circuit. However, if output load circuits are employed with the target blocks, the scale of the circuits used in the simulation tends to become large and information (various types of setting parameters and input data patterns) is required for simulation purposes not merely of the target blocks but also of the output load circuits.

If this is done, in cases where, for example, it is desired to specify the maximum delay based on the delay values in respect of all patterns of input data, the number of times that the simulation must be run and the time required for a single simulation are increased. Accordingly, simplifying (modeling) the output load circuits is executed for the scale of the simulation circuits to be decreased or for the amount of information required for the simulation to be reduced.

For example, modeling may be employed in which a transistor whose gate input terminal is the output terminal of the target block, and the parasitic capacitance thereof are divided out and the source and drain of the transistor that is thus divided out are short-circuited, or modeling may be employed in which a fixed potential is applied between the source and drain of the transistor that is thus divided out.

As related prior art, Laid-open Japanese Patent Application No. H11-296572 discloses a method of verifying the timing of a large-scale integrated circuit.

SUMMARY OF THE INVENTION

However, the simplification that was employed in the prior art was subject to the problem that the output load tends to be estimated as less than is actually the case because in the prior art simplification, a potential of the drain and the source in a simplified output load circuit are fixed. Due to the fix of the potential of the drain and the source, a mirror effect that a voltage shows substantially no change in switching to change over the ON and OFF conditions of the transistor, cannot be simulated appropriately.

Accordingly, in a circuit simulation for delay characteristic evaluation of an LSI, an object of the present invention is to provide a simulation method and associated program and simulation device for suitable approximation of the output load (i.e. that does not underestimate the output load).

According to a first aspect of the present invention, the aforesaid object is achieved by providing a simulation device that processes a simulation for evaluating delay characteristic of a logical circuit, including a storage section storing a simulation program beforehand and a control section reading said simulation program from said storage section and executing said simulation program. The control section by running said simulation program, implements: a model generating section that divides said logical circuit into a plurality of partial circuits; a selection section that selects, from the plurality of partial circuits obtained by said division, a target circuit and a load circuit connected with the subsequent stage of said target circuit, such that said partial circuit becomes, at least once, the target circuit; a simplification function that simplifies said load circuit using a transistor with which a virtual control voltage source whereby the output potential of the transistor is varied in accordance with a gate potential of the transistor is connected, by specifying a transistor driven through the output terminal of said target circuit based on said load circuit represented at transistor level and connecting to a drain of the specified transistor said virtual control voltage source; a simulation section that performs a simulation evaluating the delay characteristics of said target circuit, based on an input pattern to said target circuit with a combination of said target circuit and said simplified load circuit, for each said selected target circuit; and a library generating section that, for each path that connects an input terminal and an output terminal of said logical circuit, obtains the delay characteristics of the each path using the delay characteristics of said partial circuits included in the each path.

Also, according to a second aspect, the aforesaid object is achieved by providing a simulation device for evaluating delay characteristic of a logical circuit, including: a model generating section dividing said logical circuit into a plurality of partial circuits; a selection section selecting, from the plurality of partial circuits obtained by said division, a target circuit and a load circuit connected with the subsequent stage of said target circuit, such that said partial circuit becomes, at least once, the target circuit; a simplification section simplifying said load circuit using a transistor with which a virtual control voltage source whereby the output potential of the transistor is varied in accordance with a gate potential of the transistor is connected, by specifying a transistor driven through the output terminal of said target circuit based on said load circuit represented at transistor level and connecting to a drain of the specified transistor said virtual control voltage source; a simulation section that performs a simulation evaluating the delay characteristics of said target circuit, using an input pattern in respect of said target circuit with a combination of said target circuit and said load circuit simplified by said simplification section, for each said target circuit selected by said selection section; and a library generating section that, for each path that connects an input terminal and an output terminal of said logical circuit, obtains the delay characteristics of the each path using the delay characteristics of said partial circuits included in the each path.

Also, according to a third aspect, the aforesaid object is achieved by providing a simulation method for evaluating delay characteristic of a logical circuit, including: dividing said logical circuit into a plurality of partial circuits; selecting, from the plurality of partial circuits obtained by said division, a target circuit and a load circuit connected with the subsequent stage of said target circuit, such that said partial circuit becomes, at least once, the target circuit; specifying a transistor driven through the output terminal of said target circuit based on said load circuit represented at transistor level; connecting to a drain of the specified transistor said virtual control voltage source whereby the output potential of the transistor is varied in accordance with a gate potential of the transistor; simplifying said load circuit using said transistor with which a virtual control voltage source is connected; performing a simulation of evaluating the delay characteristics of said target circuit, based on an input pattern to said target circuit with a combination of said target circuit and said load circuit simplified in said simplifying, for each said target circuit selected in said selecting; and obtaining, for each path that connects an input terminal and an output terminal of said logical circuit, the delay characteristics of the each path using the delay characteristics of said partial circuits included in the each path.

Also, according to a fourth aspect, the aforesaid object is achieved by providing a simulation program for causing a computer that processes a simulation for evaluating delay characteristic of a logical circuit to execute: a model generating function that divides said logical circuit into a plurality of partial circuits; a selection function that selects, from the plurality of partial circuits obtained by said division, a target circuit and a load circuit connected with the subsequent stage of said target circuit, such that said partial circuit becomes, at least once, the target circuit; a simplification function that simplifies said load circuit using a transistor with which a virtual control voltage source whereby the output potential of the transistor is varied in accordance with a gate potential of the transistor is connected, by specifying a transistor driven through the output terminal of said target circuit based on said load circuit represented at transistor level and connecting to a drain of the specified transistor said virtual control voltage source; a simulation function that performs a simulation evaluating the delay characteristics of said target circuit, based on an input pattern to said target circuit with a combination of said target circuit and said simplified load circuit, for each said selected target circuit; and a library generating function that, for each path that connects an input terminal and an output terminal of said logical circuit, obtains the delay characteristics of the each path using the delay characteristics of said partial circuits included in the each path.

In said first to fourth aspects of the present invention, according to a preferred embodiment, the virtual control voltage source supplies a potential corresponding to LOW if the signal level corresponding to said gate potential is HIGH and supplies a potential corresponding to HIGH if the signal level corresponding to said gate potential is LOW.

With the present invention, a load circuit of large scale is simplified using a virtual control voltage source, thereby making it possible to avoid underestimating the load of this load circuit. In this way, simulation can be achieved with a load that is the same as, or larger than, the case where a input pattern that results in the maximum load is applied to the actual load circuit, and simulation can thus be performed that matches the actual circuit better than the prior art.

In the simulation, transistors are eliminated, other than transistor that is first discovered when the connection from the input terminal of the load circuit is traced. So simulation processing can be speeded up since the number of transistors is reduced. Since a load circuit simplified in this way does not cause an unstable circuit, there is little likelihood of operation becoming unstable due to the effect of implementing the simulator.

BRIEF DESCRIPTION OF THE DRAWINGS

FIG. 1 shows views given in explanation of delay characteristics evaluated according to an embodiment of the present invention, FIG. 1A showing, as an example, a 3-input NOR gate, FIG. 1B showing the truth-value table thereof, and FIG. 1C showing the change of output when the potential applied to a given terminal, of the three input terminals, is varied;

FIG. 8A is a view showing a partial circuit that is generated and its connection relationship;

FIG. 8B is a view showing a partial path that is included in the partial circuit that is generated;

FIG. 8C is a view showing the relationship of the path that connects the input terminal and output terminal in the entire circuit;

FIG. 9 is an example of a data structure showing the results of topology sorting;

FIG. 11 is a view showing processing for generating a propagated waveform, using a specific example, FIG. 11A being a view showing an example of the relationship of input slew and output slew in the case where a partial circuit SCC1 is the target circuit and a partial circuit SCC4 is a load circuit, and FIG. 11B being a view showing an example of the relationship of input slew and output slew in the case where the partial circuit SCC4 is the target circuit and a partial circuit SCC5 is a load circuit; and FIG. 12 is an example of a library data structure.

DESCRIPTION OF THE PREFERRED EMBODIMENTS

Embodiments of the present invention are described below with reference to the drawings. However, the technical scope of the present invention is not restricted to these embodiments and extends to the inventions set out in the patent claims and to equivalents thereof.

FIG. 1 shows views given in explanation of delay characteristics evaluated according to an embodiment of the present invention. In this embodiment, the delay time, input slew and output slew are evaluated as delay characteristics. FIG. 1A shows as an example a three-input NOR gate. FIG. 1B shows the truth-value table thereof.

FIG. 1C shows the change of output when the potential that is applied to the terminal $I_0$ is varied, when a fixed potential is applied to the terminals $I_1$, $I_2$ of the three input terminals $I_0$, $I_1$, and $I_2$. This change in potential corresponds to a change from $(I_0, I_1, I_2)=(0, 0, 0)$ to $(I_0, I_1, I_2)=(1, 0, 0)$; by referring to FIG.

1B, it can be seen that a change of signal level from H (high) to L (low) corresponding to the potential change takes place at the output terminal Out.

The delay time is the time from the time point of change of the potential applied to the input terminal $I_0$ to the time point of the change of the potential at the output terminal Out. In more detail, the delay time is calculated at the 50% level points when a transition takes place for example from a signal level L to H or from H to L. In FIG. 1C, if L=0 v and H=5 v, the delay time is the time from the time point where the voltage is 2.5 v going from H to L at the input terminal $I_0$ to the time point where the voltage becomes 2.5 v going from H to L at the output terminal Out.

The input slew or output slew is the time required for example to change from the 20% level point to the 80% level point (or the reverse) when the signal level makes a transition from L to H or from H to L. In FIG. 1C, if L=0 v and H=5 v, this is the time required to change from 1 v to 4 v (or the reverse). If a timing chart as shown in FIG. 1C is assumed, the magnitude of the input slew and output slew are expressed by the gradient of change; if the gradient is large, the slew is small, since the change takes place in a correspondingly shorter time.

In this case, the potential applied to $I_0$ was varied, but, in an actual simulation, various input pattern combinations are tried to store results in terms of delay time and output slew. For example, an input terminal to which a varying potential is applied is changed, and an input terminal to which the fixed potential is applied is changed.

Figure 2:
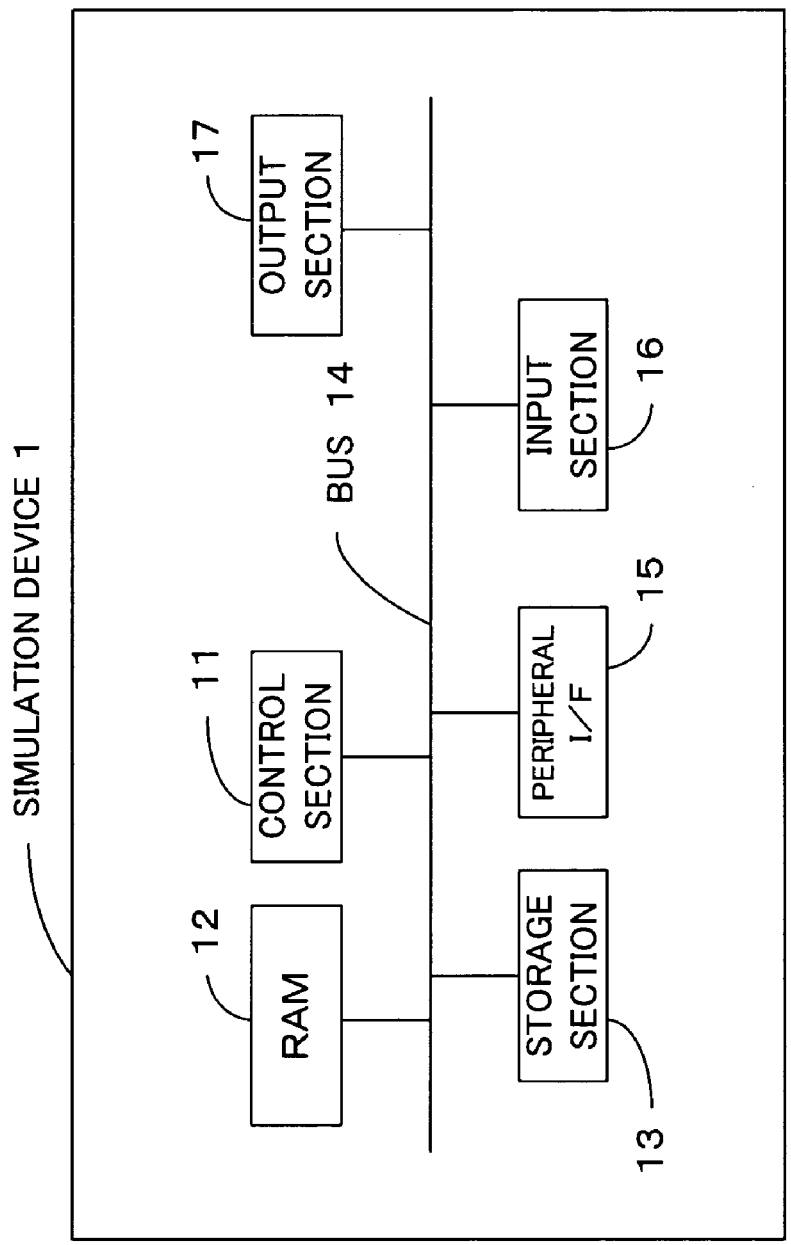
FIG. 2 is a layout block diagram of a simulation device according to an embodiment of the present invention.

FIG. 2 is a layout block diagram of a simulation device 1 according to an embodiment of the present invention. The simulation device 1 is an information processing device such as a desktop PC, notebook PC, PDA (personal digital assistant) or server and includes a control section 11, RAM (random access memory) 12, storage section 13, peripheral equipment connection interface (peripheral I/F) 15, input section 16 at which information is input, and output section 17 for outputting information for supplying information to the user. These sections, RAM 12 and peripheral I/F 15 are connected by bus 14.

The control section 11 includes a CPU (central processing section), not shown, and executes a program stored in RAM 12 and controls the various sections included in the simulation device 1. RAM 12 is a storage means for storing temporarily calculation results or programs during processing by the simulation device 1. The storage section 13 is a non-volatile storage means such as a hard disk, optical disc, magnetic disc, or flash memory and stores various types of data or programs such as the OS (operating system) before they are read into RAM 12.

The peripheral I/F 15 is an interface for connecting peripheral equipment with the simulation device 1 and may be for example a parallel port, USB (Universal Serial Bus) port or PCI card slot. Such peripheral equipment may be of many different types, such as for example a printer, TV tuner, SCSI (Small Computer Systems Interface) device, audio device, drive device, memory card reader/writer, network interface card, wireless LAN card, modem card, keyboard or mouse, or display device. The mode of connecting the peripheral and the simulation device 1 may be wired or wireless.

The output section 17 is an output means for outputting information and providing information to the user; apart from display means that present information to the user such as a CRT (cathode ray tube) or liquid crystal display, it may be for example a speaker that reads aloud instructions or information by voice so as to communicate these to the user. The input section 16 is an input means such as a keyboard or mouse whereby user requests are input. The simulation device 1 may also have a drive device such as a CD (Compact Disc), DVD (Digital Versatile Disc) or MO (magneto-optical) disc for reading storage media. By using the drive device, information stored on the storage media is read and input to the simulation device 1. That is, the drive device also functions as an input section 16.

Figure 3:
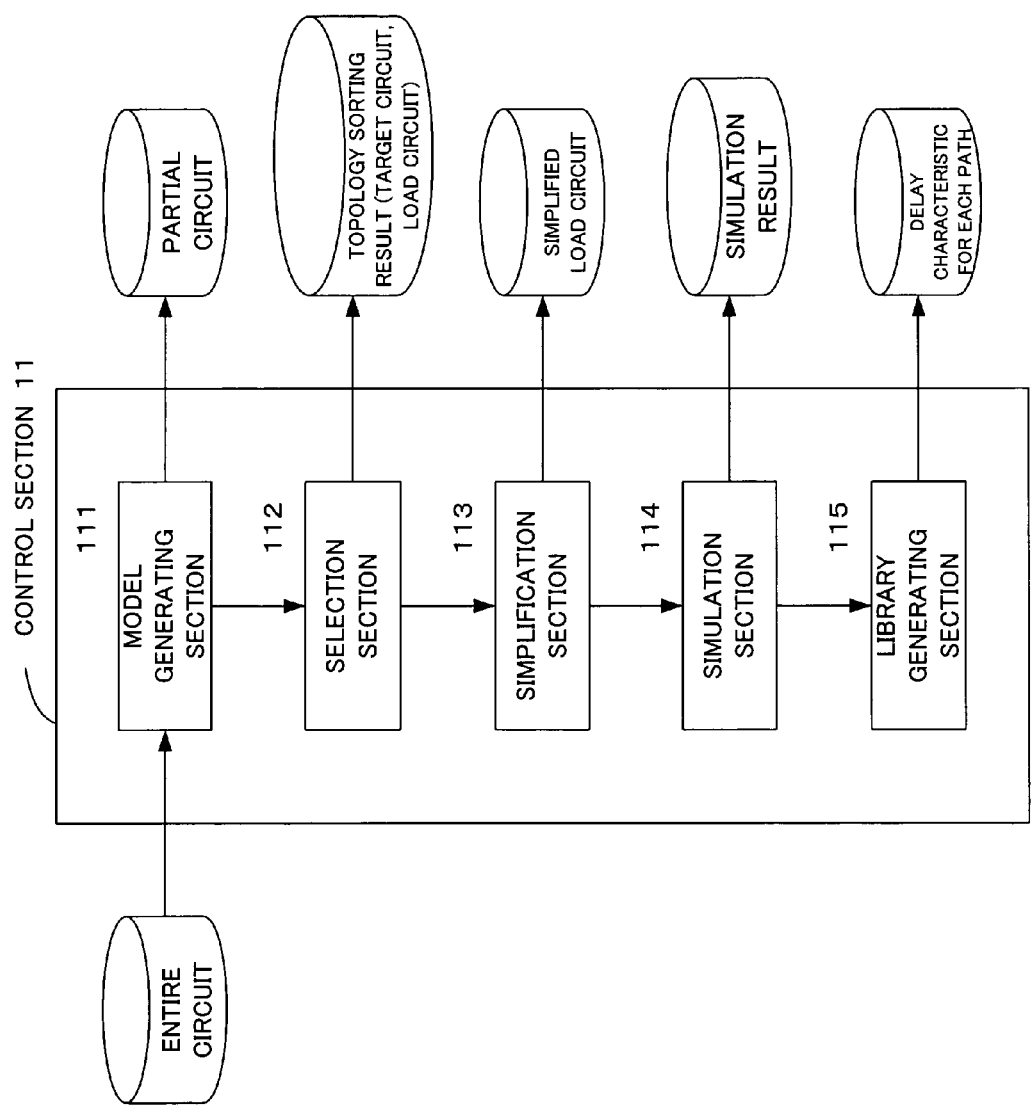
FIG. 3 is a functional block diagram given in explanation of a control section of a simulation device according to this embodiment.

FIG. 3 is a functional block diagram given in explanation of the control section 11 of the simulation device 1 according to this embodiment. The control section 11 has a model generating section 111, selection section 112, simplification section 113, simulation section 114 and library generating section 115. The various functional sections of the control section 11 are implemented as programs executed by a CPU, not shown, provided in the control section 11, but could also be implemented using hardware.

In this embodiment, the entire circuit that is a subject of evaluation of delay characteristics is divided into a plurality of partial circuits and the delay characteristics of the entire circuit are evaluated using the delay characteristics of the partial circuits. Its characteristic feature of this embodiment is that, in evaluating the delay characteristics of the partial circuits, if the scale of the load circuit downstream of the partial circuit to be evaluated (this will be called the "target circuit") is large, underestimation of the load is prevented by adding a virtual control voltage source capable of varying the output potential of a transistor included in the load circuit in accordance with the gate potential of this transistor. In the storage section 13, the net list of the entire circuit that is the subject of evaluation of delay characteristics is entered and stored beforehand at gate level or transistor level.

The model generating section 111 divides the entire circuit into a plurality of partial circuits in accordance with the net list of the entire circuit. For example, in the case where the entire circuit is described at transistor level, connections that may be traced to the power source (Vdd), earth (Vss) or a gate terminal of another transistor are obtained, taking as starting point the drain connections of P channel MOS transistors (hereinbelow abbreviated as PMOS) and N channel MOS transistors (hereinbelow abbreviated as NMOS); such power source, earth, transistors and resistors etc included in the mode of connection found as the search result are designated as source-connected device clusters (abbreviated as SCCs). If this is done, all of the transistors, resistors and linear inductors etc in the entire circuit described at transistor level can be divided without overlap into a plurality of clusters and, as a result, the entire circuit divided into a plurality of partial circuits. It should be noted that, when performing division using such SCCs, if the entire circuit is described at gate level, the model generating section 111 may convert the entire circuit to a description at transistor level in pre-processing.

The selection section 112 selects among the plurality of partial circuits, as a target circuit, a partial circuit to which delay characteristic evaluation is to be performed and selects as a load circuit, a partial circuit that is connected downstream of this target circuit. The selection section performs selection such that each of the plurality of partial circuits is selected as the target circuit once, and stores, in association therewith, the load circuit corresponding to each target circuit in the storage section 13. A plurality of sets of target circuit and load circuit are thereby generated.

Further the selection section 112 assigns a ranking to each set by performing topology sorting to determine the optimum order for simulation of the above generated sets and stores this ranking in the storage section 13 as the topology sorting result. The topology-sorting algorithm may be for example that higher ranking is assigned in accordance with closer proximity to the input terminal of the entire circuit.

The simplification section 113 simplifies load circuit using the above described virtual control voltage, if the scale of the load circuit that is associated with the target circuit is large on simulating in the order of the topology sorting results. The manner in which this simplification is achieved is described below.

The simulation section 114 generates an input pattern in respect of the target circuit, and evaluates the delay characteristics of the target circuit on simulating in the order of the topology sorting results. The results of the simulation are stored as simulation results in the storage section 13.

The library generating section 115 evaluates the delay characteristics of the entire circuit from the delay characteristics of the partial circuits obtained as simulation results. In this way, the delay characteristics of each path linking an input terminal and output terminal in the entire circuit are evaluated and, as a result, the delay characteristics of the entire circuit are elucidated.

Figure 4:
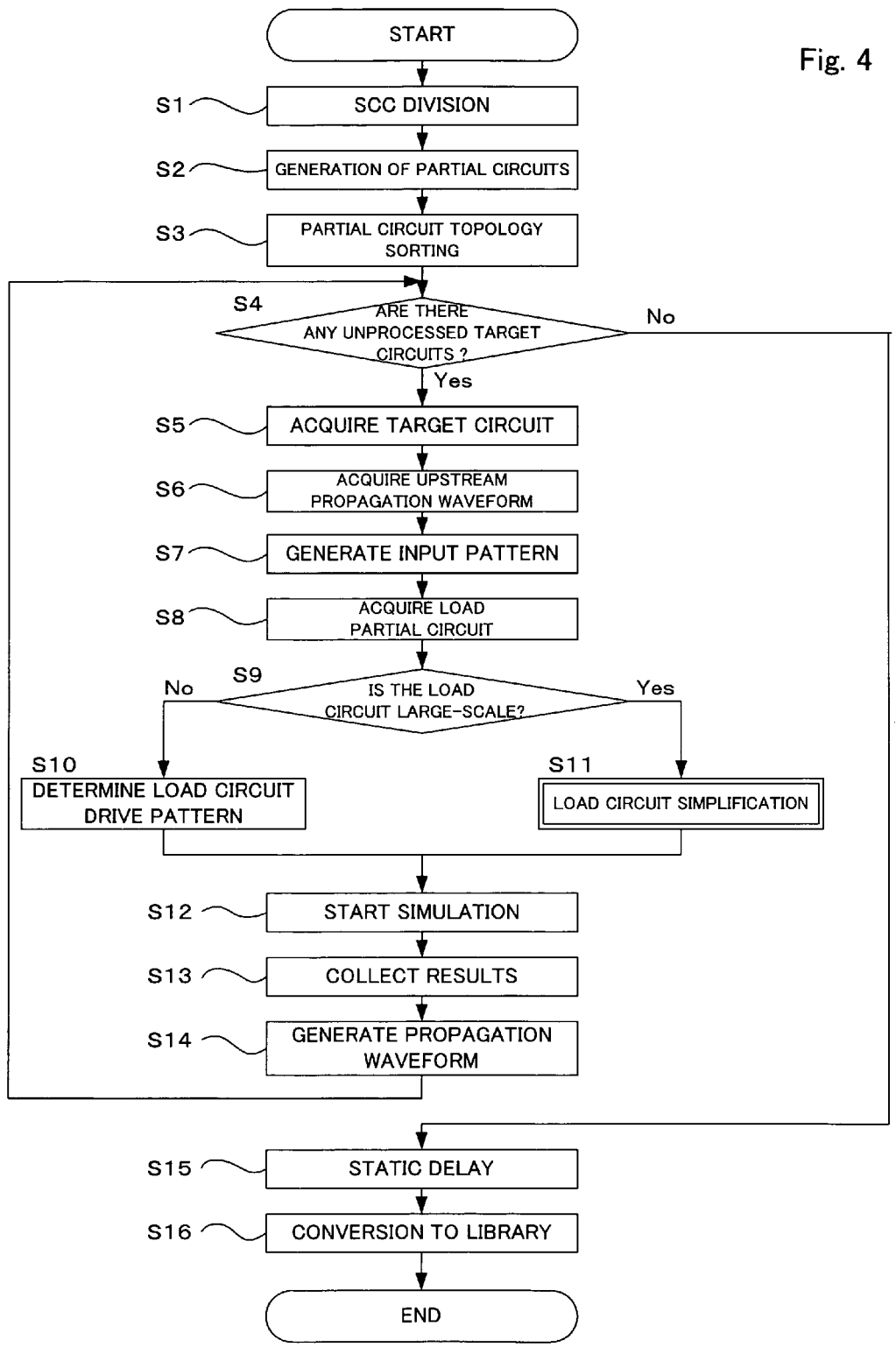
FIG. 4 is a flow chart given in explanation of the operation of a simulation device according to this embodiment.

FIG. 4 is a flow chart given in explanation of the operation of a simulation device 1 according to this embodiment.

First of all, the model generating section 111 divides the entire circuit into SCCs (S1). The division into SCCs is as described with reference to the model generating section 111 of FIG. 3.

Then, the model generating section 111 generates partial circuits based on the SCCs (S2). Of course, the simplest method of generating partial circuits is to employ the clusters generated by the division into SCCs directly (in one-to-one correspondence) as partial circuits. The significance of the step S2 is that this step is used to additionally designate, as partial circuits, combinations of several clusters obtained by the division into SCCs.

When the step S2 is completed, the selection section 112 performs topology sorting of the partial circuits (S3) As described above, the selection section 112 first of all selects a target circuit from the plurality of partial circuits and then selects load circuits from the partial circuits connected downstream of this target circuit. The selection section 112 repeats this operation such that each of the plurality of partial circuits is designated once as the target circuit. A plurality of combinations of target circuits and load circuits are then stored in the storage section 13 as the result of this topology sorting. The result of the topology sorting further includes a ranking corresponding to each combination such that target circuits that are located nearer to the input terminal in the entire circuit have higher ranking for simulation.

Simulation is then performed in respect of each of the target circuits. First of all, a decision is made as to whether there are any target circuits that have not yet been processed (S4). The meaning of this step is that simulation is still not yet completed if there are any unprocessed target circuits.

If there are any unprocessed target circuits (S4 Yes) the simulation section 114 acquires the net list of such target circuits (S5). Then, if there is any partial circuit which delay characteristic evaluation has already been completed and which is upstream of the target circuit that has been acquired in the step S5, the delay characteristics of this partial circuit are acquired (S6). If there are some serially connected partial circuit, the output slews may be progressively restricted in prescribed ranges in the downstream direction. The reason for performing the step S6 is that, since the output of a partial circuit whose simulation has been completed provides the input for the target circuit, if the delay characteristics of the upstream stage are employed, the number of input patterns to be generated in the next step can be reduced, thereby making it possible to speed up simulation.

When the step S6 has been completed, the simulation section 114 generates an input pattern (S7). As shown in FIG. 1C, an input pattern includes a combination of input information (L, H, change from L to H, change from H to L, timing of change) to the input terminals of the target circuit and/or input slew.

Next, a load circuit corresponding to the target circuit that has been acquired in the step S5 is acquired (S8). In the step S8, the simplification section 113 acquires the net list of the load circuit. The simplification section 113 then decides whether the scale of the load circuit is large, on the basis of the number of transistors included in the load circuit that has been acquired (S9). If the number of transistors is larger than a prescribed threshold value, the load circuit scale is identified as "large" (S9 Yes) and the simplification section 113 performs simplification of the load circuit (S11). The processing of the step S10 will next be described using FIG. 5.

On the other hand, if the number of transistors is smaller than the prescribed threshold value, the load circuit scale is identified as being "small" (S9 No) and the simplification section 113 therefore determines the drive pattern of the load circuit without performing simplification of the load circuit (S10). Determination of the drive pattern of the load circuit contains specifying input information such that the number of transistors included in the load circuit that make a transition of electronic conduction state is a maximum, when the input information to the input terminals of the load circuit is given. And the determination also includes determining as the load circuit for simulation a circuit under the condition of the transistors in case such input information is supplied. In addition, the input information for which the number of transistors that make a transition of conduction state is a minimum may be specified, and a circuit under the condition of these transistors in case such input information is supplied may be designated as the load circuit. The former case represents simulation of maximum load and the latter case represents simulation of minimum load. It is in fact sufficient simply to perform simulation of maximum load.

Apart from inputting the output from the target circuit, the load circuit may have other input terminals. It is therefore necessary to assign load circuits corresponding to respective input patterns if taking into consideration the input pattern to the target circuit. This in turn would make it necessary to perform simulation a plurality of times in respect of a single set of target circuit and load circuit. This problem is therefore avoided by determining the drive pattern of the load circuit in accordance with the step S10. It should be noted that, as will be described, this problem is also avoided if simplification is performed in the step S11, since it is not necessary to perform simulation a plurality of times in respect of a single set of target circuit and load circuit. In this way, simulation processing can be speeded up.

When processing by the simplification section 113 in accordance with the step S10 or S11 is completed, the simulation section 114 measures the delay characteristics (i.e. the delay time and/or output slew) when the input pattern generated in the step S7 is applied to the target circuit, using the target circuit acquired in the step S5 and the load circuit whose drive pattern was determined in the step S10 or which was simplified in the step S11 (S12). The measured delay characteristics are collected and stored in the storage section 13 as simulation results of the target circuits (S13).

At this point, the simulation section 114 generates a propagation waveform (data for input pattern generation utilized in the case where another partial circuit located on the downstream side of the target circuit acquired in the step S5 is employed as the target circuit) for use in the step S6 (S14). In this way, simulation of a single set of target circuit and load circuit included in the topology sorting results is concluded and the delay characteristics of the target circuit are thereby obtained. When this step S14 is completed, control again returns to the step S4 and simulation is performed in respect of the remaining sets.

When simulation has been thus completed in respect of all of the sets of target circuit and load circuit included in the topology sorting results, a check is made (S4 No) to ascertain that there are no unprocessed target circuits and the library generating section 115 then carries out static delay analysis to find the delay characteristics of the entire circuit, using the delay characteristics of the partial circuits (S15), and stores the result in the storage section 13 as a library entry, thereby completing the simulation (S16).

In the static delay analysis in the step S15, first of all, for each path connecting an input terminal and output terminal of the entire circuit, the partial circuits included in the path are specified and the delay time of the path is obtained by adding up the delay times of these partial circuits. Regarding the output slew, the output slew of the end of the serially-connected partial circuit included in this path is then obtained as the output slew of the entire circuit.

Figure 5:
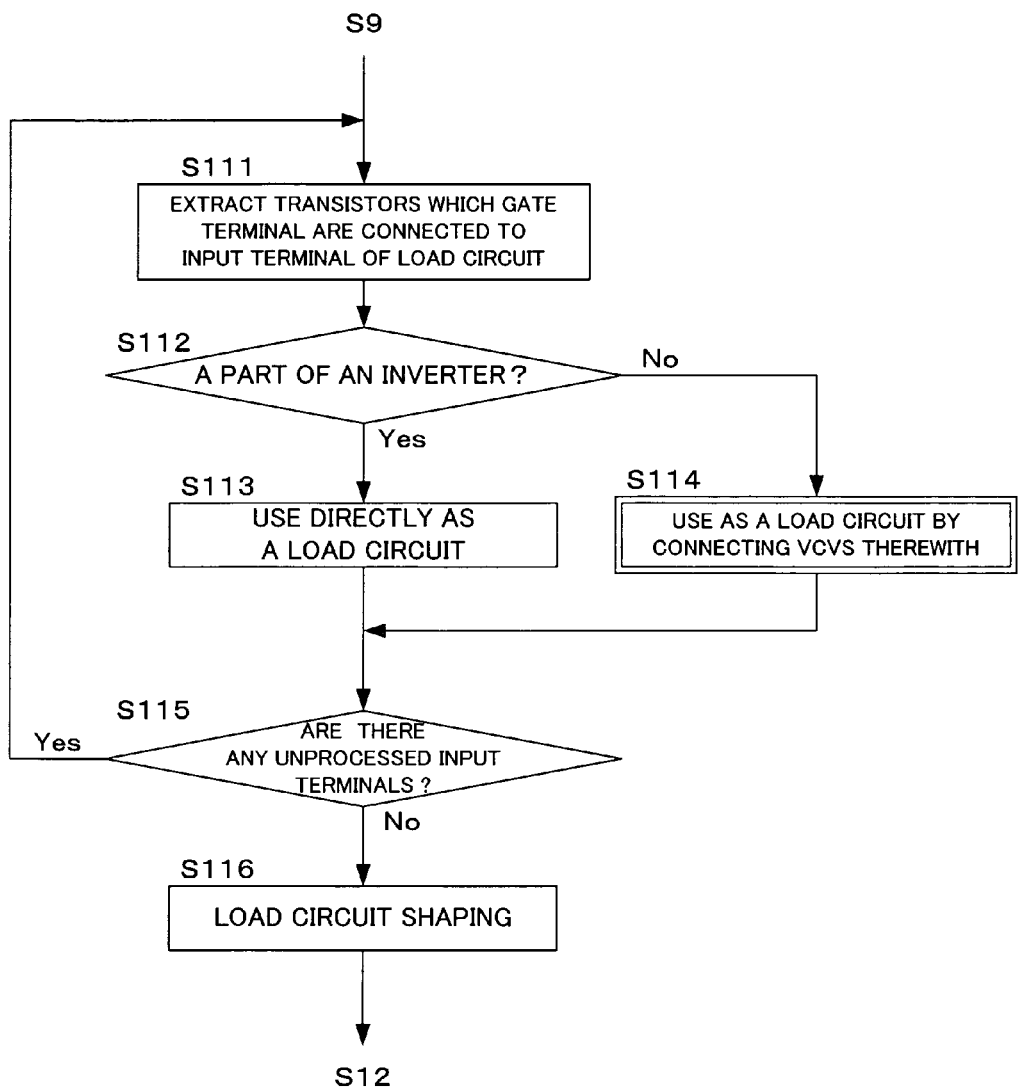
FIG. 5 is a flow chart given in explanation of the operation of a simplification section when simplifying a load circuit.

FIG. 5 is a flow chart given in explanation of the operation of the simplification circuit 113 that is used to simplify load circuits. This explains a detailed description of the step S11 in FIG. 4. First of all, a transistor which gate terminal is connected to an input terminal of the load circuit is extracted (S111). If this transistor that is thus extracted is not apart of an inverter (S112 No), a virtual control voltage source (hereinbelow abbreviated to VCVS) whereby the output potential of the transistor is varied in accordance with the gate potential is added at the drain of this extracted transistor (S114). The VCVS in this embodiment applies a potential corresponding to Low if the signal level corresponding to the gate potential is High and a potential corresponding to High if the signal level corresponding to the gate potential is Low. The method of connecting the VCVS in the step S114 will next be described in detail with reference to FIG. 6.

If the extracted transistor is a part of an inverter (S112 Yes), this is directly treated as a load circuit and no special processing is performed (S113). In the case of a transistor forming an inverter, the problem giving the premise of the present invention does not arise, so connection of a virtual control voltage source is unnecessary.

When the step S113 or S114 is completed, a decision is made as to whether or not any of the input terminals of the load circuit remain unprocessed (S115). If there are any unprocessed input terminals (S115 Yes), control returns to the step S111 and processing is continued. When processing in respect of all of the input terminals of the load circuit has been completed (S115 No), shaping of the load circuit is performed (S116). This circuit shaping in the step S116 means that elements other than the transistors extracted in the step S111 (for each input terminal of the load circuit) are deleted.

Figure 6A:
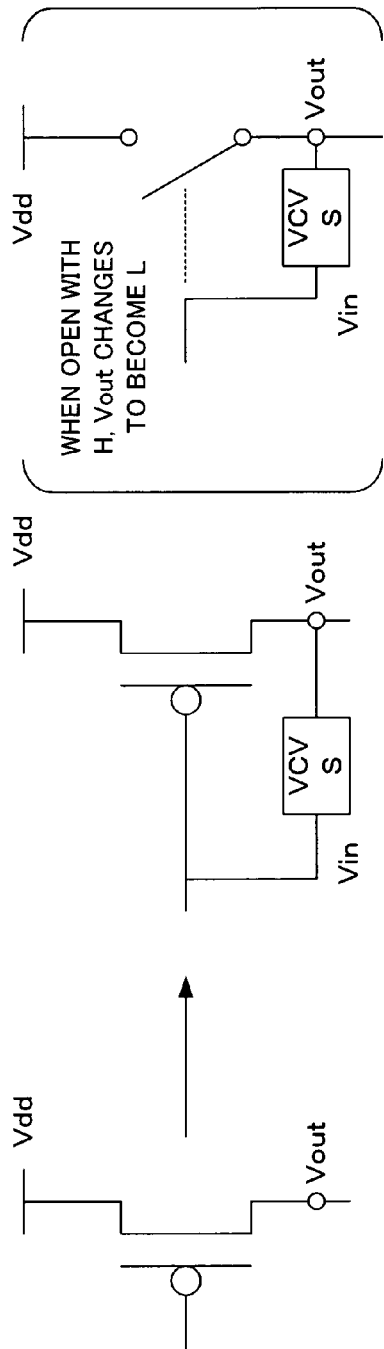
FIG. 6 are views given in explanation of a method of connecting a virtual control voltage source (VCVS), FIG. 6A showing the case of PMOS and FIG. 6B showing the case of NMOS, respectively.
Figure 6B:
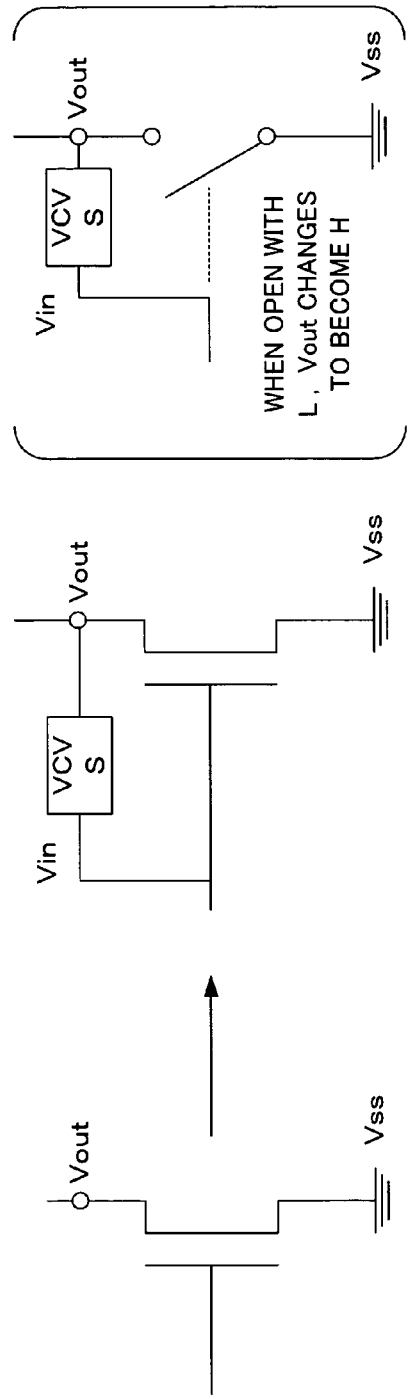

FIG. 6 is a view given in explanation of a method of connecting a virtual control voltage source (VCVS). FIG. 6A shows the case of PMOS and FIG. 6B shows the case of NMOS, respectively. The left-hand view in FIG. 6A shows the condition prior to connection of the VCVS; the view in the middle of FIG. 6A shows the condition after connection of the VCVS. As shown in FIG. 6A, the VCVS is connected to the drain opposite to the power source Vdd in PMOS.

The right-hand view (view in the brackets) of FIG. 6A is a view showing diagrammatically PMOS in a condition with VCVS connected. In this figure, the PMOS is described as a switch that is opened with the gate potential H (High) and that is connected with the gate potential L (Low). As is clear from this figure, when the switch is opened with the signal level of the gate potential being H, a potential corresponding to signal level Low is supplied as the output potential Vout of the transistor. In this way, the phenomenon of the output potential Vout of the transistor showing no change during switching can be avoided and there is also no possibility of underestimation of the load of the load circuit.

The right-hand view in FIG. 6B (view in the brackets) is a view showing diagrammatically NMOS in a condition with VCVS connected. In this figure, the NMOS is described as a switch that is opened when the gate potential is L (Low) and that is connected opened when the gate potential is H (High). As is clear from this figure, when the switch is opened with the signal level of the gate potential being L, a potential corresponding to signal level High is supplied as the output potential Vout of the transistor. In this way, the phenomenon of the output potential Vout of the transistor showing no change during switching can be avoided and there is also no possibility of underestimation of the load of the load circuit.

Next, a specific description is given of the above processing, using an example of an entire circuit. Reference should be made as appropriate to FIG. 4 (and in some cases to FIG. 5).

Figure 7:
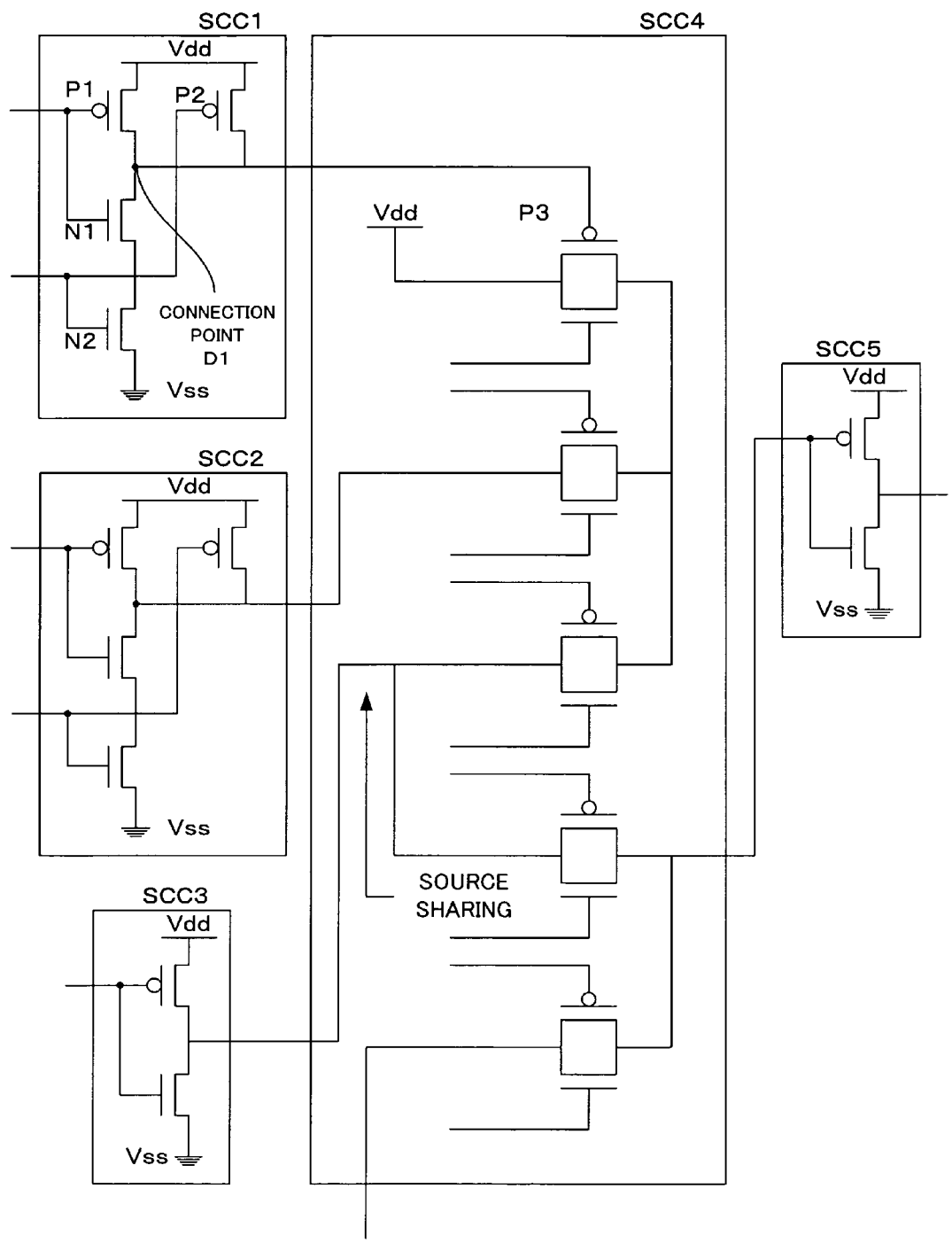
FIG. 7 is a view showing an example of an entire circuit.

FIG. 7 is a view showing an example of an entire circuit. FIG. 7 shows the condition in which the entire circuit is divided into a plurality of partial circuits (partial circuits SCC1 to SCC5). The way in which the partial circuits shown in FIG. 7 are formed from the original entire circuit is as follows.

First of all, the entire circuit is divided into SCCs (see FIG. 4 step S1). For example, in the case of the partial circuit SCC1, the location of drain connection of the P channel MOS transistor P1 and N channel MOS transistors N1 is sought. When this is done, the connection point D1 is obtained. Taking this connection point D1 as the starting point, when connections are traced until connection reaches the power source Vdd, earth Vss or a gate of another transistor, connection reaches the power source through the transistor P1 and connection reaches the earth through the transistor N1 and transistor N2; connection also reaches the power source through the transistor P2 and connection reaches the gate of the transistor P3. In this way, the elements included in the range in which connection can be traced from the connection point D1 are clustered, defining the cluster SCC1.

If clustering is performed in the same way at another location, the clusters SCC2 to cluster SCC5 are likewise formed. FIG. 7 shows the result of directly substituting these clusters for the partial circuits (see FIG. 4 step S2).

As described in FIG. 4 step S2, the clusters formed by the SCCs and the partial circuits need not be in one-to-one correspondence. For example, a single partial circuit may be formed by combining the cluster SCC3 and the cluster SCC4.

FIG. 8A is a view showing the partial circuits that are thus generated and their connection relationship. The partial circuit SCC1 has two input terminals, namely, terminal Q1 and terminal Q2 and an output terminal Q6. This terminal Q6 also functions one of the input terminals of the partial circuit SCC4. The other partial circuits also have similar input terminals and output terminals, the output terminals of upstream partial circuits becoming input terminals of downstream partial circuits.

FIG. 8B is a view showing a partial path included in a partial circuit that is thus generated. The partial circuit SCC1 includes a partial path R11 that connects the terminal Q1 and the terminal Q6 and a partial path R12 that connects the terminal Q2 and the terminal Q6. Partial paths that connect the input terminals and output terminals are also formed in the case of the other partial circuits.

FIG. 8C is a view showing the relationship of the paths that connect the input terminals and output terminals in the entire circuit. The input terminals in the entire circuit are terminal Q1 to Q5 and terminal Q9 and the output terminal is terminal Q11. Consequently, the six paths, namely, PATH1 to PATH6 shown in FIG. 8C may be listed as the paths that connect the input terminals and output terminal in the entire circuit.

The object of the simulation is to evaluate the delay characteristics of the paths shown in FIG. 8C from the delay characteristics of the partial circuits.

FIG. 9 is an example data layout showing the results of topology sorting performed in the step S3 of FIG. 4. The topology sorting results of FIG. 9 contains the data items: "ranking" and "combination".

"Combination" is an identifier that specifies the partial circuit that was selected as the target circuit and the partial circuit that was selected as the load circuit corresponding to this target circuit. The target circuit is indicated in front of the plus (+) symbol and the load circuit is indicated after this symbol. The "ranking" is a ranking indicating the sequential order in which this combination is simulated.

As described with reference to FIG. 4, the selection section 112 assigns rankings such that simulation is effected in sequence from target circuits that are closest to the input terminal of the entire circuit, so, for example in the case of the entire circuit shown in FIG. 7, the target circuits may be identified in the sequence of the partial circuits SCC1, SCC2, SCC3, SCC4 and SCC5. The selection section 112 may then simply select as the load circuit one of the partial circuits that are connected downstream. Then a topology sorting result as shown in FIG. 9 is thereby obtained.

Next, in steps S4 to S14 in FIG. 4, the delay characteristics of the partial circuits are evaluated. As shown in FIG. 9, in this case, the delay characteristics are evaluated as the beginning when an input pattern generated in the step S7 of FIG. 4 is applied to the partial circuit SCC1, taking the partial circuit SCC1 as the target circuit and the partial circuit SCC4 as the load circuit.

In this case, the partial load circuit SCC4 includes a pass transistor, in the pass transistors that share drain output, that shares source input with another transistor and, as a result, the circuit scale is large. In general, there may be further daisy-chaining. Accordingly, in this embodiment, when this partial circuit SCC4 is employed as a load circuit, the result of the evaluation of circuit scale performed in the step S9 of FIG. 4 is that the circuit scale is evaluated as being large (S9 Yes) and simplification using a VCVS is effected (FIG. 4 step S11, FIG. 5 step S114).

Figure 10:
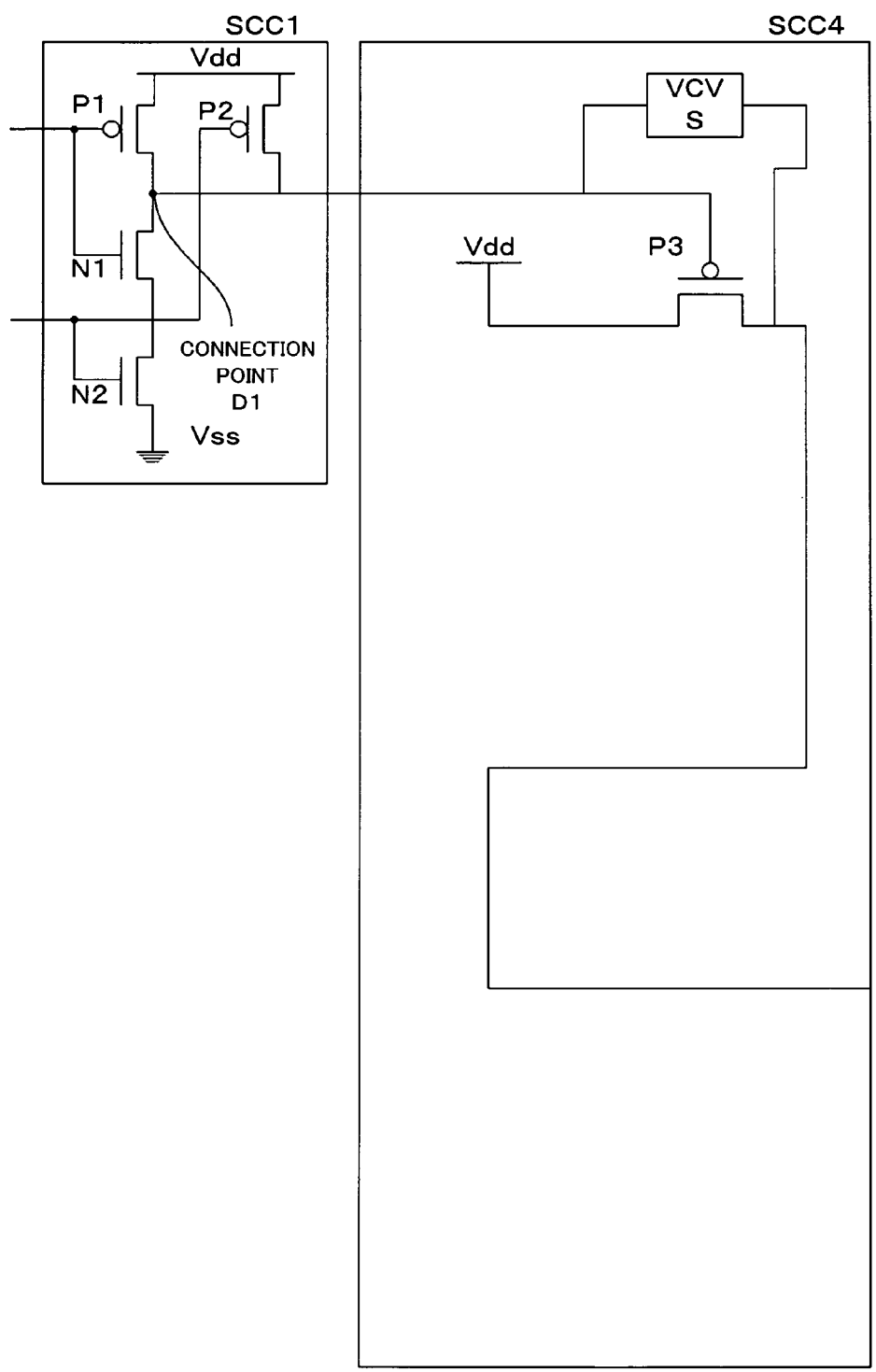
FIG. 10 is a view showing an example of a simplification using VCVS.

FIG. 10 is a view showing an example of simplification using a VCVS when the partial circuit SCC4 is employed as a load circuit. As shown in FIG. 8A, there are four inputs, namely, terminals Q6 to Q9, to the partial circuit SCC4 but connection to the gate terminal of a transistor is only effected by a connection from the terminal Q6, which is connected with the P channel MOS transistor P3 (FIG. 5 step S111).

If this P channel MOS transistor P3 is present on its own, it is not a part of an inverter (FIG. 5 step S112 No) so a VCVS is connected with its drain (FIG. 5 step S114). In this way, elements other than the P channel MOS transistor P3 that is connected with the VCVS are shaped (deleted) in the step S116. Finally when the partial circuit SCC1 is taken as the target circuit and the partial circuit SCC4 is taken as the load circuit (i.e. the initial data entry in FIG. 9), the simplified load circuit shown in FIG. 10 is employed.

FIG. 11A and FIG. 11B is a view showing the processing of generating the propagation waveform in the step S14 of FIG. 4, using a specific example. FIG. 11A is a view showing an example of the relationship between the input slew and output slew in the case where the partial circuit SCC1 is taken as the target circuit and the partial circuit is taken as the load circuit. In this case, an input pattern is generated using five input slews F1 to F5 as the input slews supplied to the input terminals Q1, Q2 of the target circuit. As a result of the simulation, the output slew at the output terminal Q6 is restricted to the two output slews F2, F3. The output slews F2, F3 are assumed to be of the same waveform (gradient) as the input slews F2, F3.

Accordingly, in the step S14 of FIG. 4, the simulation section 114 stores a gradient or a waveform of the output slew (for example, output slew F2, F3) generated as a result of the simulation whereby various input slews (the aforementioned input slews F1 to F5) are applied to the target circuit. Now the gradient is times required for changing for example from the 20% level point to the 80% level point (or in the opposite direction) when effecting a transition of signal level from L to H or from H to L. Also, the range of output slews that can be taken (range from the minimum value to the output value) may be stored.

FIG. 11B is a view showing an example of the relationship between input slew and output slew in the case where the partial circuit SCC4 is taken as the target circuit and the partial circuit SCC5 is taken as the load circuit. Referring to FIG. 9, the delay characteristics of the partial circuits SCC1, SCC2, SCC3 are already obtained prior to simulating the target circuit SCC4. Consequently, as shown in FIG. 11B, when the input pattern in respect of the target circuit SCC4 is restricted to the output slew of the partial circuit whose simulation has already been completed, the time required for the simulation section 114 to generate the input pattern can thereby be reduced. Thus, when another partial circuit located on the downstream side of the target circuit that was acquired in step S5 of FIG. 4 is employed as the target circuit, the output slew of the partial circuit whose simulation has been completed is extracted (FIG. 4 step S6); the processing load for generating the input pattern in the "other partial circuit" is thereby reduced (FIG. 4 step S7).

Hereinbelow, the delay characteristics of the target circuits are evaluated sequentially using the results of the topology sorting shown in FIG. 9. It should be noted that, in the case of the partial circuit SCC5 that is closest to the output terminal in the entire circuit, since this partial circuit SCC5 has no downstream partial circuit connected therewith, in this case only, simulation is performed by preparing an external load whose operating characteristics are known. When the processing of the steps S4 to S14 has been completed in respect of all of the target circuits, the library generating section 115 obtains the delay characteristics of the entire circuit from the delay characteristics of the partial circuits.

FIG. 12 is a data layout example of a library generated by the library generating section 115. The library of FIG. 12 includes the data items "path", "input/output pattern", "maximum/minimum", "delay time" and "output slew".

"Path" is a path that connects an input terminal and an output terminal in the entire circuit and corresponds to the paths PATH1 to PATH6 shown in FIG. 8C. The "input/output pattern" corresponds to input and output. For example, "Up→Up" indicates a pattern in which, when the input is changed from L to H, the output also changes from to L to H. "Up→Down" indicates a pattern in which, when the input is changed from L to H, the output changes from to H to L. The same applies to the remaining patterns.

"Maximum/minimum" shows flag information to identify the maximum delay time and minimum delay time. "Delay time" indicates the delay time of the entire path; specifically, this represents the sum of the delay times in each of the partial circuits included in the entire path. The maximum delay time may then be obtained by adding all of the maximum delay times in the individual partial circuits and the minimum delay time may be obtained by adding all of the minimum delay times in the individual partial circuits.

The "output slew" indicates the output slew of the entire path; specifically, it is found as the output slew in the end of the serially-connected partial circuit (partial circuit closest to the output terminal) included in the entire path. The object of evaluating the delay characteristics of the path shown in FIG. 8C may thus be achieved using the delay characteristics of the partial circuits.

As described above, with this embodiment, it is possible to prevent underestimation of the load of a load circuit by simplifying large-scale load circuits using a virtual control voltage source. In this way, it becomes possible to perform simulation with a load that is the same as, or larger than, the case where a pattern such as to produce maximum load is actually applied to the load circuit. Simulation can thereby be achieved that conforms more closely to an actual circuit than was the case conventionally.

Simulation processing can also be speeded up by simplification, in which the number of transistors is cut by eliminating transistors other than those discovered initially when connections are traced from the input terminals of the load circuit. Since the load circuit that is thus simplified does not constitute an unstable circuit, there is little likelihood of operation becoming unstable due to the effect of incorporating a simulator.

What is claimed is:

1. A simulation device that processes a simulation for evaluating delay characteristics of a logical circuit, comprising:
   a storage section storing a simulation program beforehand; and
   a control section reading said simulation program from said storage section and executing said simulation program, wherein
   said control section, by running said simulation program, implements:
   a model generating section that divides said logical circuit into a plurality of partial circuits;
   a selection section that selects, from the plurality of partial circuits obtained by said division, a target circuit and a load circuit connected with a subsequent stage of said target circuit, such that each partial circuit becomes, at least once, the target circuit;
   a simplification section that simplifies said load circuit using a transistor with which a virtual control voltage source is connected to a drain of the transistor, whereby the output potential of the transistor is varied in accordance with a gate potential of the transistor;
   a simulation section that performs a simulation evaluating the delay characteristics of said target circuit, based on an input pattern to said target circuit with a combination of said target circuit and said simplified load circuit, for each said selected target circuit; and
   a library generating section that, for each path that connects an input terminal and an output terminal of said logical circuit, obtains the delay characteristics of the each path using the delay characteristics of said partial circuits included in the each path, and
   wherein said virtual control voltage source supplies a potential corresponding to LOW if the signal level corresponding to said gate potential is HIGH and supplies a potential corresponding to HIGH if the signal level corresponding to said gate potential is LOW.

2. A simulation device, that processes a simulation for evaluating delay characteristics of a logical circuit, comprising:
   a storage section storing a simulation program beforehand; and
   a control section reading said simulation program from said storage section and executing said simulation program, wherein
   said control section, by running said simulation program, implements:
   a model generating section that divides said logical circuit into a plurality of partial circuits;
   a selection section that selects, from the plurality of partial circuits obtained by said division, a target circuit and a load circuit connected with a subsequent stage of said target circuit, such that each partial circuit becomes, at least once, the target circuit;
   a simplification section that simplifies said load circuit using a transistor with which a virtual control voltage source is connected to a drain of the transistor, whereby the output potential of the transistor is varied in accordance with a gate potential of the transistor;
   a simulation section that performs a simulation evaluating the delay characteristics of said target circuit, based on an input pattern to said target circuit with a combination of said target circuit and said simplified load circuit, for each said selected target circuit; and
   a library generating section that, for each path that connects an input terminal and an output terminal of said logical circuit, obtains the delay characteristics of the each path using the delay characteristics of said partial circuits included in the each path, and
   wherein said control section does not perform simplification in cases where the transistor that is driven through an output terminal of said target circuit is a part of an inverter.

3. A simulation device, that processes a simulation for evaluating delay characteristics of a logical circuit, comprising:
   a storage section storing a simulation program beforehand; and
   a control section reading said simulation program from said storage section and executing said simulation program, wherein
   said control section, by running said simulation program, implements:
   a model generating section that divides said logical circuit into a plurality of partial circuits;
   a selection section that selects, from the plurality of partial circuits obtained by said division, a target circuit and a load circuit connected with a subsequent stage of said target circuit, such that each partial circuit becomes, at least once, the target circuit;
   a simplification section that simplifies said load circuit using a transistor with which a virtual control voltage source is connected to a drain of the transistor, whereby the output potential of the transistor is varied in accordance with a gate potential of the transistor;
   a simulation section that performs a simulation evaluating the delay characteristics of said target circuit, based on an input pattern to said target circuit with a combination of said target circuit and said simplified load circuit, for each said selected target circuit; and a library generating section that, for each path that connects an input terminal and an output terminal of said logical circuit, obtains the delay characteristics of the each path using the delay characteristics of said partial circuits included in the each path, and wherein said control section further specifies a transistor that is driven through an input terminal of said load circuit but that is not driven through an output terminal of said target circuit, and performs said simplification in respect of the specified transistor.

4. A simulation device, that processes a simulation for evaluating delay characteristics of a logical circuit, comprising:

a storage section storing a simulation program beforehand; and a control section reading said simulation program from said storage section and executing said simulation program, wherein said control section, by running said simulation program, implements:

a model generating section that divides said logical circuit into a plurality of partial circuits;

a selection section that selects, from the plurality of partial circuits obtained by said division, a target circuit and a load circuit connected with a subsequent stage of said target circuit, such that each partial circuit becomes, at least once, the target circuit;

a simplification section that simplifies said load circuit using a transistor with which a virtual control voltage source is connected to a drain of the transistor, whereby the output potential of the transistor is varied in accordance with a gate potential of the transistor;

a simulation section that performs a simulation evaluating the delay characteristics of said target circuit, based on an input pattern to said target circuit with a combination of said target circuit and said simplified load circuit, for each said selected target circuit; and a library generating section that, for each path that connects an input terminal and an output terminal of said logical circuit, obtains the delay characteristics of the each path using the delay characteristics of said partial circuits included in the each path, and wherein said control section shapes a load circuit by deleting elements, said elements included in said load circuit, other than transistors driven through an output terminal of said target circuit.

5. A simulation device for evaluating delay characteristics of a logical circuit, comprising:

a computer comprising:

model generating section dividing said logical circuit into a plurality of partial circuits;

a selection section selecting, from the plurality of partial circuits obtained by said division, a target circuit and a load circuit connected with a subsequent stage of said target circuit, such that each partial circuit becomes, at least once, the target circuit;

a simplification section simplifying said load circuit using a transistor with which a virtual control voltage source is connected to a drain of the transistor, whereby the output potential of the transistor is varied in accordance with a gate potential of the transistor;

a simulation section that performs a simulation evaluating the delay characteristics of said target circuit, using an input pattern to said target circuit with a combination of said target circuit and said load circuit simplified by said simplification section, for each said target circuit selected by said selection section; and a library generating section that, for each path that connects an input terminal and an output terminal of said logical circuit, obtains the delay characteristics of the each path using the delay characteristics of said partial circuits included in the each path, and wherein said virtual control voltage source supplies a potential corresponding to LOW if the signal level corresponding to said gate potential is HIGH and supplies a potential corresponding to HIGH if the signal level corresponding to said gate potential is LOW.

6. A simulation method, in a simulation apparatus having a control unit, for evaluating delay characteristics of a logical circuit, comprising:

dividing said logical circuit into a plurality of partial circuits, by the control unit;

selecting, from the plurality of partial circuits obtained by said division, a target circuit and a load circuit connected with a subsequent stage of said target circuit, such that each partial circuit becomes, at least once, the target circuit, by the control unit;

specifying a transistor driven through the output terminal of said target circuit based on said load circuit represented at transistor level, by the control unit;

connecting to a drain of the specified transistor a virtual control voltage source whereby the output potential of the transistor is varied in accordance with a gate potential of the transistor, by the control unit;

simplifying said load circuit using said transistor with which a virtual control voltage source is connected, by the control unit;

performing a simulation of evaluating the delay characteristics of said target circuit, based on an input pattern to said target circuit with a combination of said target circuit and said simplified load circuit, for each said selected target circuit, by the control unit;

obtaining, for each path that connects an input terminal and an output terminal of said logical circuit, the delay characteristics of the each path using the delay characteristics of said partial circuits included in the each path, by the control unit; and storing the delay characteristics of the each path in a storing section, by the control unit, and wherein said virtual control voltage source supplies a potential corresponding to LOW if the signal level corresponding to said gate potential is HIGH and supplies a potential corresponding to HIGH if the signal level corresponding to said gate potential is LOW.

7. A simulation method, in a simulation apparatus having a control unit, for evaluating delay characteristics of a logical circuit, comprising:

dividing said logical circuit into a plurality of partial circuits, by the control unit;

selecting, from the plurality of partial circuits obtained by said division, a target circuit and a load circuit connected with a subsequent stage of said target circuit, such that each partial circuit becomes, at least once, the target circuit, by the control unit;

specifying a transistor driven through the output terminal of said target circuit based on said load circuit represented at transistor level, by the control unit;

connecting to a drain of the specified transistor a virtual control voltage source whereby the output potential of the transistor is varied in accordance with a gate potential of the transistor, by the control unit;

simplifying said load circuit using said transistor with which a virtual control voltage source is connected, by the control unit;

performing a simulation of evaluating the delay characteristics of said target circuit, based on an input pattern to said target circuit with a combination of said target circuit and said simplified load circuit, for each said selected target circuit, by the control unit;

obtaining, for each path that connects an input terminal and an output terminal of said logical circuit, the delay characteristics of the each path using the delay characteristics of said partial circuits included in the each path, by the control unit; and storing the delay characteristics of the each path in a storing section, by the control unit, and wherein the simplifying is not performed in cases where the transistor that is driven through an output terminal of said target circuit is a part of an inverter.

8. A simulation method, in a simulation apparatus having a control unit, for evaluating delay characteristics of a logical circuit, comprising:

dividing said logical circuit into a plurality of partial circuits, by the control unit;

selecting, from the plurality of partial circuits obtained by said division, a target circuit and a load circuit connected with a subsequent stage of said target circuit, such that each partial circuit becomes, at least once, the target circuit, by the control unit;

specifying a transistor driven through the output terminal of said target circuit based on said load circuit represented at transistor level, by the control unit;

connecting to a drain of the specified transistor a virtual control voltage source whereby the output potential of the transistor is varied in accordance with a gate potential of the transistor, by the control unit;

simplifying said load circuit using said transistor with which a virtual control voltage source is connected, by the control unit;

performing a simulation of evaluating the delay characteristics of said target circuit, based on an input pattern to said target circuit with a combination of said target circuit and said simplified load circuit, for each said selected target circuit, by the control unit;

obtaining, for each path that connects an input terminal and an output terminal of said logical circuit, the delay characteristics of the each path using the delay characteristics of said partial circuits included in the each path, by the control unit; and storing the delay characteristics of the each path in a storing section, by the control unit, and specifying a transistor that is driven through an input terminal of said load circuit but that is not driven through an output terminal of said target circuit, by the control unit; and performing said simplification in respect of the specified transistor, by the control unit.

9. A simulation method, in a simulation apparatus having a control unit, for evaluating delay characteristics of a logical circuit, comprising:

dividing said logical circuit into a plurality of partial circuits, by the control unit;

selecting, from the plurality of partial circuits obtained by said division, a target circuit and a load circuit connected with a subsequent stage of said target circuit, such that each partial circuit becomes, at least once, the target circuit, by the control unit;

specifying a transistor driven through the output terminal of said target circuit based on said load circuit represented at transistor level, by the control unit;

connecting to a drain of the specified transistor a virtual control voltage source whereby the output potential of the transistor is varied in accordance with a gate potential of the transistor, by the control unit;

simplifying said load circuit using said transistor with which a virtual control voltage source is connected, by the control unit;

performing a simulation of evaluating the delay characteristics of said target circuit, based on an input pattern to said target circuit with a combination of said target circuit and said simplified load circuit, for each said selected target circuit, by the control unit;

obtaining, for each path that connects an input terminal and an output terminal of said logical circuit, the delay characteristics of the each path using the delay characteristics of said partial circuits included in the each path, by the control unit; and storing the delay characteristics of the each path in a storing section, by the control unit, and wherein the load circuit is shaped by deleting elements, said elements included in said load circuit, other than transistors driven through an output terminal of said target circuit.

10. A computer-readable storage storing a simulation program for being caused by a computer that processes a simulation for evaluating delay characteristics of a logical circuit to execute a process comprising:

dividing said logical circuit into a plurality of partial circuits;

selecting, from the plurality of partial circuits obtained by said division, a target circuit and a load circuit connected with a subsequent stage of said target circuit, such that each partial circuit becomes, at least once, the target circuit;

simplifying said load circuit using a transistor with which a virtual control voltage source is connected to a drain of the transistor, whereby the output potential of the transistor is varied in accordance with a gate potential of the transistor;

performing a simulation evaluating the delay characteristics of said target circuit, based on an input pattern to said target circuit with a combination of said target circuit and said simplified load circuit, for each said selected target circuit; obtaining, for each path that connects an input terminal and an output terminal of said logical circuit, the delay characteristics of the each path using the delay characteristics of said partial circuits included in the each path; and storing the delay characteristics of the each path in a storing section, and wherein said virtual control voltage source supplies a potential corresponding to LOW if the signal level corresponding to said gate potential is HIGH and supplies a potential corresponding to HIGH if the signal level corresponding to said gate potential is LOW.

11. A computer-readable storage storing a simulation program for being caused by a computer that processes a simulation for evaluating delay characteristics of a logical circuit to execute a process comprising:

dividing said logical circuit into a plurality of partial circuits;

selecting, from the plurality of partial circuits obtained by said division, a target circuit and a load circuit connected with a subsequent stage of said target circuit, such that each partial circuit becomes, at least once, the target circuit;

simplifying said load circuit using a transistor with which a virtual control voltage source is connected to a drain of the transistor, whereby the output potential of the transistor is varied in accordance with a gate potential of the transistor;

performing a simulation evaluating the delay characteristics of said target circuit, based on an input pattern to said target circuit with a combination of said target circuit and said simplified load circuit, for each said selected target circuit; obtaining, for each path that connects an input terminal and an output terminal of said logical circuit, the delay characteristics of the each path using the delay characteristics of said partial circuits included in the each path; and storing the delay characteristics of the each path in a storing section, and wherein said simplifying does not perform simplification in cases where the transistor that is driven through an output terminal of said target circuit is a part of an inverter.

12. A computer-readable storage storing a simulation program for being caused by a computer that processes a simulation for evaluating delay characteristics of a logical circuit to execute a process comprising:

dividing said logical circuit into a plurality of partial circuits;

selecting, from the plurality of partial circuits obtained by said division, a target circuit and a load circuit connected with a subsequent stage of said target circuit, such that each partial circuit becomes, at least once, the target circuit;

simplifying said load circuit using a transistor with which a virtual control voltage source is connected to a drain of the transistor, whereby the output potential of the transistor is varied in accordance with a gate potential of the transistor;

performing a simulation evaluating the delay characteristics of said target circuit, based on an input pattern to said target circuit with a combination of said target circuit and said simplified load circuit, for each said selected target circuit; obtaining, for each path that connects an input terminal and an output terminal of said logical circuit, the delay characteristics of the each path using the delay characteristics of said partial circuits included in the each path; and storing the delay characteristics of the each path in a storing section, and wherein said simplifying further specifies a transistor that is driven through an input terminal of said load circuit but that is not driven through an output terminal of said target circuit, and performs said simplifying in respect of the specified transistor.

13. A computer-readable storage storing a simulation program for being caused by a computer that processes a simulation for evaluating delay characteristics of a logical circuit to execute a process comprising:

dividing said logical circuit into a plurality of partial circuits;

selecting, from the plurality of partial circuits obtained by said division, a target circuit and a load circuit connected with a subsequent stage of said target circuit, such that each partial circuit becomes, at least once, the target circuit;

simplifying said load circuit using a transistor with which a virtual control voltage source is connected to a drain of the transistor, whereby the output potential of the transistor is varied in accordance with a gate potential of the transistor;

performing a simulation evaluating the delay characteristics of said target circuit, based on an input pattern to said target circuit with a combination of said target circuit and said simplified load circuit, for each said selected target circuit; obtaining, for each path that connects an input terminal and an output terminal of said logical circuit, the delay characteristics of the each path using the delay characteristics of said partial circuits included in the each path; and storing the delay characteristics of the each path in a storing section, and wherein said simplifying shapes a load circuit by deleting elements, said elements included in said load circuit, other than transistors driven through an output terminal of said target circuit.

* * * * *